US 8,362,476 B2

United States Patent
Schoenfeld

(10) Patent No.: US 8,362,476 B2
(45) Date of Patent: Jan. 29, 2013

(54) CUBIC SEMICONDUCTOR ALLOYS FOR DEEP UV APPLICATIONS

(75) Inventor: Winston V. Schoenfeld, Oviedo, FL (US)

(73) Assignee: University of Central Florida Research Foundation, Inc., Orlando, FL (US)

( * ) Notice: Subject to any disclaimer, the term of this patent is extended or adjusted under 35 U.S.C. 154(b) by 428 days.

(21) Appl. No.: 12/726,545

(22) Filed: Mar. 18, 2010

(65) Prior Publication Data

US 2010/0237344 A1 Sep. 23, 2010

Related U.S. Application Data

(60) Provisional application No. 61/161,270, filed on Mar. 18, 2009.

(51) Int. Cl.
*H01L 29/10* (2006.01)
*H01L 29/24* (2006.01)

(52) U.S. Cl. ............... 257/43; 257/55; 257/103

(58) Field of Classification Search .............. 257/43, 257/55, 103, E29.068
See application file for complete search history.

(56) References Cited

U.S. PATENT DOCUMENTS

| | | | |
|---|---|---|---|
| 6,046,464 A * | 4/2000 | Schetzina | 257/96 |
| 6,423,983 B1 | 7/2002 | Narayan et al. | |
| 7,348,226 B2 * | 3/2008 | Bojarczuk et al. | 438/164 |
| 2009/0236595 A1 * | 9/2009 | Atanackovic | 257/43 |

* cited by examiner

*Primary Examiner* — Hung Vu
(74) *Attorney, Agent, or Firm* — Jetter & Associates, P.A.

(57) ABSTRACT

A cubic epitaxial article and electronic devices therefrom includes a single crystal cubic oxide substrate having a substrate band gap and a top surface. An epitaxial cubic oxide alloy layer that includes at least one transition metal or group IIA metal disposed on the top surface of the substrate. The epitaxial cubic oxide alloy layer has a band gap that is different than the substrate band gap and has a lattice that is lattice matched within 5% to a lattice of the single crystal cubic oxide substrate.

20 Claims, 3 Drawing Sheets

| Sample | Eg Measured | Estimated Mg Concentration (1-x) |
|---|---|---|
| NiO | 3.56 | 0 |
| $T_{Mg}$=315 | 4.01 | 0.18 |
| $T_{Mg}$=330 | 4.29 | 0.30 |
| $T_{Mg}$=345 | 4.46 | 0.37 |
| $T_{Mg}$=360 | 4.66 | 0.45 |
| MgO | 6 | 1 |

US 8,362,476 B2

CUBIC SEMICONDUCTOR ALLOYS FOR DEEP UV APPLICATIONS

CROSS REFERENCE TO RELATED APPLICATIONS

This application claims the benefit of Provisional Application Ser. No. 61/161,270 entitled "CUBIC SEMICONDUCTOR ALLOYS FOR DEEP UV APPLICATIONS" filed Mar. 18, 2009, which is herein incorporated by reference in its entirety.

FEDERAL RIGHTS

The U.S. Government has rights to subject matter disclosed herein based on Army Research Office Contract #W911NF-07-D-0001-TCN-07-162-1.

FIELD OF THE INVENTION

Disclosed embodiments relate to optoelectronic and microelectronic devices and fabrication methods thereof, and more particularly to cubic metal oxide semiconductor epitaxial articles and semiconductor devices therefrom.

BACKGROUND

Ultraviolet (UV) photodetectors and light emitters find numerous uses including applications in the defense, commercial, and scientific arenas. These include, for example, covert space-to-space communications, missile threat detection, chemical and biological threat detection and spectroscopy, UV environmental monitoring, and germicidal cleansing. Detectors and light emitters operating in the solar blind region are of special interest. The solar blind region corresponds to the spectral UV region where strong upper atmospheric absorption of solar radiation occurs, generally at wavelengths <290 nm. This creates a natural low background window for detection of man-made UV sources on and proximate to the earth's surface.

Semiconducting materials having a 25° C. band gap of about 4 to 6 eV have been used to sense or generate solar blind UV radiation. Conventional approaches have used semiconductors such as AlGaN, MgZnO, or BeZnO, which generally have wurtzite (hexagonal) lattice structures. AlGaN is known to suffer from various problems including cracking due to strain, generally high dislocation density, and lattice mismatch (all such effects are generally interrelated). High dislocation density undesirably reduces internal quantum efficiency. The use of wurtzite MgZnO is limited due to phase segregation that occurs for mid-Mg compositions as a result of a solid solubility limits and mixed phase regions. BeZnO is a somewhat more promising material, but has experienced doping difficulties, particularly difficulties in getting high mobility and stable p-type doping.

Additionally, problems arise from the lack of a suitable lattice matched substrate, leading to higher dislocation densities, and also the polarization fields that are common with these wurtzite (hexagonal) lattice structures. Accordingly, high quality single crystal epitaxial articles, and a process for forming the same for operation at wavelengths <290 nm, particularly in the 200-290 nm region, are needed.

SUMMARY

Disclosed embodiments include cubic epitaxial articles and electronic devices therefrom that comprise a single crystal cubic oxide substrate. An epitaxial cubic oxide alloy layer that includes at least one transition metal or group IIA metal is disposed on the top surface of the substrate. The epitaxial cubic oxide alloy layer has a band gap that is different than the substrate band gap and has a lattice that is lattice matched within 5% to a lattice of the single crystal cubic oxide substrate. The band gap of the epitaxial cubic oxide alloy layer at 25° C. is generally from 4 to 6 eV.

BRIEF DESCRIPTION OF THE DRAWINGS

FIG. 3A shows transmission (in arbitrary units-au) vs. wavelength (nm) for NiMgO alloys according to an embodiment of the invention that evidences tuneablity of the operating wavelength by varying the metal concentrations in the alloy, while

DETAILED DESCRIPTION

Figure 1A:
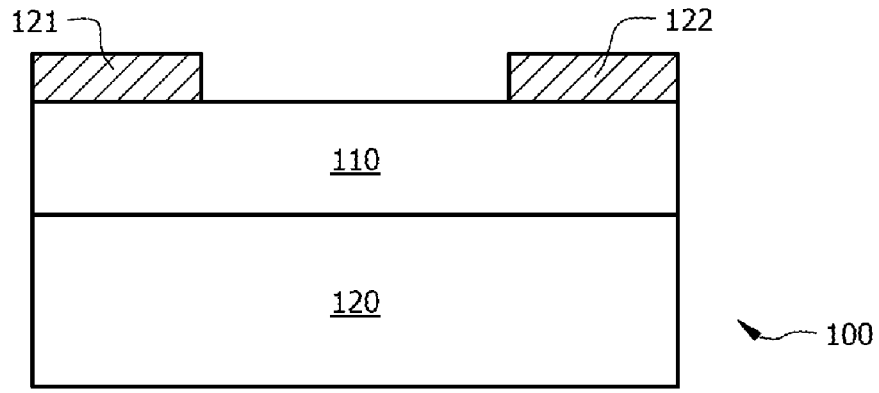
FIG. 1A shows a cross sectional depiction of a metal-semiconductor-metal (MSM) photodetector comprising interdigitated metal fingers oppositely laying on the surface of an epitaxial cubic oxide alloy layer, according to a disclosed embodiment.

Disclosed embodiments are described with reference to the attached figures, wherein like reference numerals are used throughout the figures to designate similar or equivalent elements. The figures are not drawn to scale and they are provided merely to illustrate disclosed features. Several disclosed aspects are described below with reference to example applications for illustration. It should be understood that numerous specific details, relationships, and methods are set forth to provide a full understanding of the subject matter disclosed herein. One having ordinary skill in the relevant art, however, will readily recognize subject matter disclosed herein can be practiced without one or more of the specific details or with other methods. In other instances, well-known structures or operations are not shown in detail to avoid obscuring certain details. This disclosure is not limited by the illustrated ordering of acts or events, as some acts may occur in different orders and/or concurrently with other acts or events. Furthermore, not all illustrated acts or events are required to implement a methodology in accordance with this Disclosure.

Disclosed embodiments describe new semiconductor alloys that are operable in the solar blind region, and processes for forming such semiconductor alloys. In one embodiment of the invention, a cubic epitaxial article comprises a single crystal cubic oxide substrate having a substrate band gap and a top surface, and at least one epitaxial cubic oxide alloy layer comprising at least one transition metal or group IIA metal on the top surface of the substrate. The epitaxial cubic oxide alloy layer has a band gap (Eg) that is different as compared to the substrate $E_g$ and a lattice that is lattice matched within 5% to a lattice of the substrate. More typically the lattice matching is within 2%, and in some embodiments matched within 1.5%. The band gap of the epitaxial cubic oxide alloy layer at 25° C. is generally from 4 to 6 eV.

As known in the art, lattices in three dimensions generally have three lattice constants, commonly referred to as a, b, and c. However, in the special case of cubic for cubic crystal structures, all of the lattice constants are equal and only a single lattice parameter is referred to, generally as a. Therefore, lattice matching as used herein for cubic articles refers to the matching of the single lattice parameter, a, between the respective materials.

The exemplary cubic oxide materials described herein all have the "rock salt" or "sodium chloride" (halite) structure, which as known in the art is a special case for a cubic structure. In the rock salt structure each of the two atom types forms a separate face-centered cubic lattice, with the two lattices interpenetrating so as to form a 3D checkerboard pattern. As a result, each atom has six nearest neighbors, with octahedral geometry. Examples of compounds with the rock salt structure include sodium chloride, and many divalent metal oxides, sulfides, selenides, and tellurides. More generally, the rock salt structure is more likely to be formed if the cation is slightly smaller than the anion (e.g., a cation/anion radius ratio of 0.414 to 0.732). However, in other embodiments of the invention the cubic oxide materials and epitaxial articles therefrom can be based on cubic crystal structures other than rock salt.

In a typical embodiment, the epitaxial cubic oxide alloy layer has a 25° C. band gap (Eg) that is narrower, such as at least 10% narrower, as compared to the Eg of the substrate. However, in other embodiments, the Eg of the epitaxial cubic oxide alloy layer can have a wider (larger) 25° C. band gap as compared to the Eg of the substrate, such as at least 10% wider.

The substrate is generally at least 50 μm thick, such as 300 to 800 μm thick. The substrate Eg is generally at least 5.8 eV at 25° C. In one embodiment, the substrate comprises single crystal MgO, which is a low cost commercially available substrate. Single crystal MgO substrates have an Eg corresponding to a wavelength of around 170 nm (about 7.6 eV at 25° C.), and a cubic crystal structure.

In one embodiment, the substrate comprises or consists essentially of MgO and the epitaxial cubic oxide alloy layer comprises MgO and at least one alloying metal that moves the MgO band gap from 170 nm to 200 nm or higher. In this embodiment, the epitaxial cubic oxide alloy layer can comprise MgO and at least one transition alloying metal, such as at least one of Ni (i.e., NiMgO) and Co (i.e., CoMgO). The Inventor has recognized that NiO and CoO both have narrower band gaps as compared to MgO and are also cubic, and significantly only have ~1% lattice mismatch with respect to MgO. The transition alloying metal generally can generally comprise 1 to 80 wt % of the epitaxial cubic oxide alloy, such as 20 to 80 wt % of the epitaxial cubic oxide alloy layer. In another embodiment, the epitaxial cubic oxide alloy layer can be exclusive of Mg, such as a NiCoO alloy.

Epitaxial cubic oxide alloy layers are generally described herein as providing an Eg that corresponds to a wavelength above 200 nm. However, in other embodiments of the invention the epitaxial cubic oxide alloy provides an Eg that corresponds to a wavelength below 200 nm, such as a wavelength between 150 nm and 200 nm. The thickness of the epitaxial cubic oxide alloy layer is generally 5 nm to 5 μm.

An epitaxial cubic buffer layer can be interposed between the top surface of the substrate and the epitaxial cubic oxide alloy layer. Buffer layers may simply serve to increase the crystal quality above that of the substrate, but can also be used to maintain the same lattice matching (e.g. lattice matched buffer layer). The buffer layer is typically included to smooth the surface and promote higher quality epilayer growth. The buffer layer can comprise MgO, such as mixed metal buffers including NiMgO. The thickness of the buffer layer is generally 5 nm to 1 μm.

Articles according to embodiments of the invention can be formed using molecular beam epitaxy (MBE). Alternatively, other methods may be used, such as, but not limited to, metal-organic chemical vapor deposition (MOCVD) or pulsed laser deposition (PLD).

An electronic device comprises the cubic epitaxial article described above, and a pair of electrodes having the epitaxial cubic oxide alloy layer interposed therebetween. The electronic device can comprises an optoelectronic device, such as an LED, laser diode, photodetector, optical modulator, or a broad band light source. In one embodiment, the electronic device comprises a metal-semiconductor-metal (MSM) photodiode having interdigitated fingers.

Electronic devices that emit light (ex. LED, laser, etc.) include extrinsic p-type and n-type doping. Typically, a layer above the buffer layer is n-type doped, followed by an undoped active region, and then by a p-type layer. The n-type doped and p-type doped layers can switch positions so that the n-type doped layer is instead on top. Moreover, these layers do not need to be of the same composition or alloy. For example, an n-type ZnMgO and p-type NiMgO layer may be used.

FIG. 1A shows a cross sectional depiction of a MSM photodetector 100 comprising interdigitated metal fingers 121 and 122 oppositely laying on the surface of an epitaxial cubic oxide alloy layer 110, according to a disclosed embodiment. The MSM photodetector 100 can be a solar-blind photodetector. The metal fingers 121 and 122 form diode fingers with the epitaxial cubic oxide alloy layer 310. The metal fingers 121 and 122 can be formed by optical lithography. In a typical embodiment the finger gaps are several microns. The epitaxial cubic oxide alloy layer 110 is shown on a cubic substrate 120.

Figure 1B:
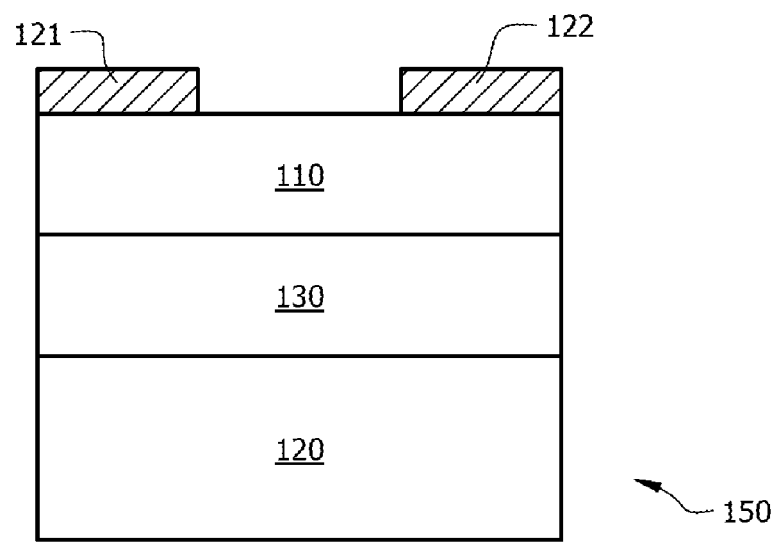
FIG. 1B shows a cross sectional depiction of a MSM photodetector comprising interdigitated metal fingers oppositely laying on the surface of an epitaxial cubic oxide alloy layer, where the cubic oxide alloy layer is disposed on an epitaxial buffer layer, according to another disclosed embodiment.

FIG. 1B shows a cross sectional depiction of a MSM photodetector 150 comprising interdigitated metal fingers 121 and 122 oppositely laying on the surface of an epitaxial cubic oxide alloy layer 110, according to another disclosed embodiment. The MSM photodetector 150 can be a solar-blind photodetector. The metal fingers 121 and 122 form diode fingers with the epitaxial cubic oxide alloy layer 110. The epitaxial cubic oxide alloy layer 110 is shown on an epitaxial buffer layer 130 which is on a cubic substrate 120.

Figure 2:
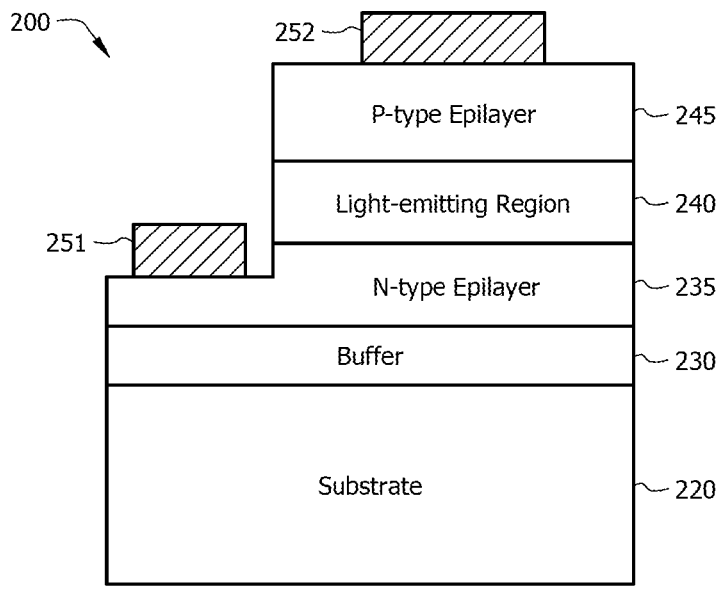
FIG. 2 shows a cross sectional depiction of an exemplary light emitting diode (LED), according to another disclosed embodiment.

FIG. 2 shows a cross sectional depiction of an exemplary LED 200, according to another disclosed embodiment. LED is an epitaxial article that includes substrate 220, buffer layer 230, with an n-type epitaxial layer 235 on the buffer layer 230. A light emitting region 240 that is typically undoped is above the n-type epilayer. A p-type epitaxial layer 245 is on the light emitting region 240. A first metal contact 251 provides contact to n-type epilayer 235, while a second metal contact 252 provides contact to p-type epilayer 245. As described above, the epitaxial layers 230, 235, 240 and 245 do not need to be of the same composition or alloy. For example, n-type epilayer 235 can comprise an n-type ZnMgO layer while p-type epilayer 245 can comprise a p-type NiMgO layer. The structure for other light emitting devices, such as a laser diode, would be very similar to LED 200 shown in FIG. 2.

Doping of n- and p-type cubic oxide epilayers will typically be performed in-situ using substitutional elements, such as, but not limited to, Al, Ga, In, N, Sb, P, or Sb. P-type doping is generally to be accomplished by, but not limited to, substitution of a group V-B element for oxygen, while n-type can be accomplished by substitution of a group III-B element for the metal cation (ex. Mg, or Ni). Concentrations of the dopants typically range from $10^{16}/cm^3$ to $10^{20}/cm^3$. Ion implantation and other non-in-situ doping methods may also be employed.

EXAMPLES

Embodiments of the invention are further illustrated by the following specific Examples, which should not be construed as limiting the scope or content of this Disclosure in any way.

Using MBE, NiMgO and ZnMgO as exemplary epitaxial cubic oxide alloy layers were epitaxially grown on commercially obtained bulk single crystal MgO (100) (substrates. However, other substrate orientations, such as (111) MgO substrates could have been used. Both of these epitaxial cubic oxide alloy layers provided good results, with NiMgO providing the best results in terms of the ability to grow the alloys on MgO with energy gap/composition tunability while maintaining high quality single crystal epilayers. High quality refers to qualities such as low roughness and well-defined absorption characteristics that as described above can be tuned through the 200-300 nm region.

Transmission data and atomic force microscope (AFM) images demonstrated the high quality of the films formed. For example, using AFM, a 10 nm thick NiO film evidenced a short range (1 $\mu m^2$) RMS roughness ($R_{RMS}$) of <2 Angstroms up to 40 wt. % Nickel in NiMgO when grown on top of a MgO substrate having an $R_{RMS}$ roughness of 1.9 Angstroms.

Figure 3A:
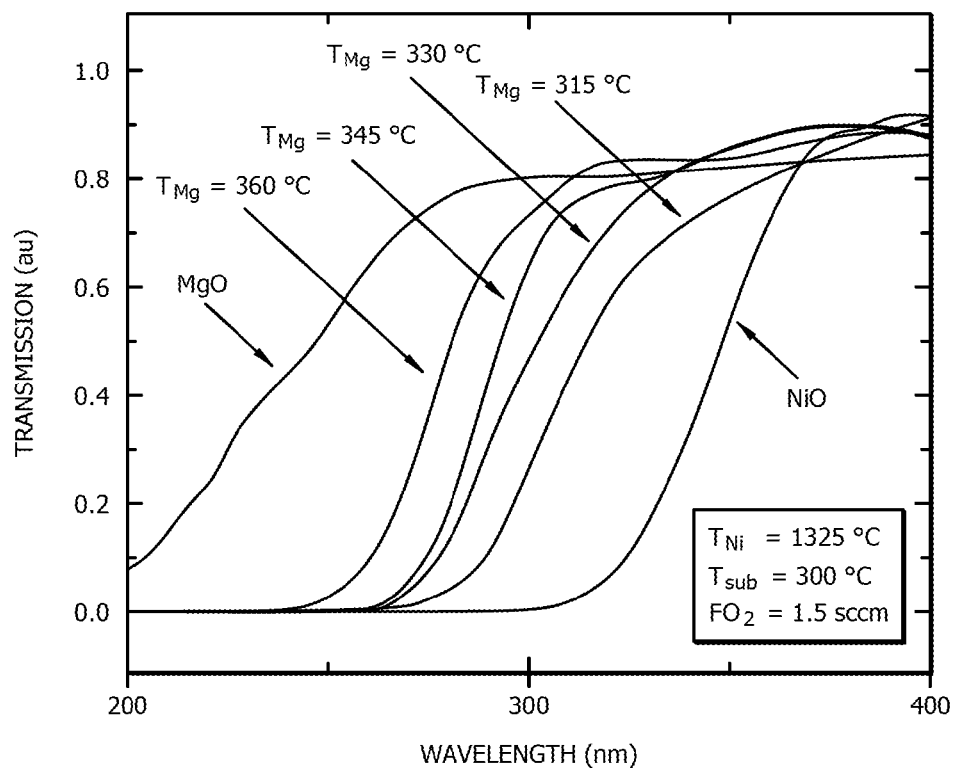
Figures 3B, 4:
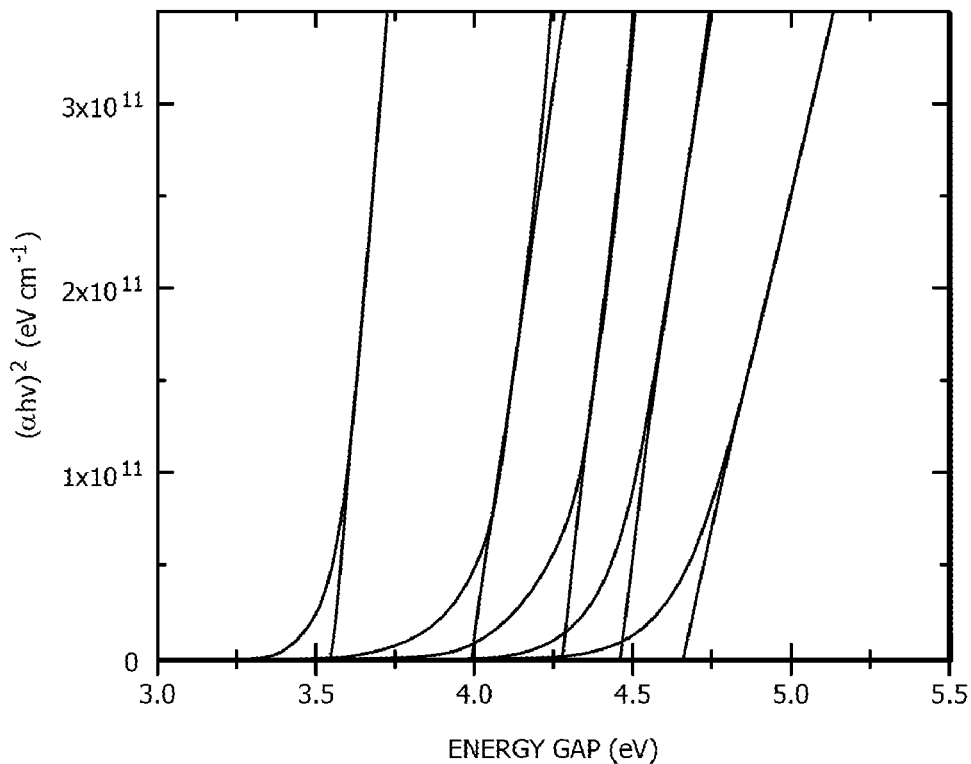
FIG. 3B shows the corresponding Energy Gap (Eg) of the MgNiO alloy obtained by varying the metal concentrations.
FIG. 4 shows data obtained for the various samples shown in FIGS. 3A and 3B including the measured 25° C. Eg and estimated Mg concentration (with Ni concentrations being fixed for a given Mg concentration) for each of the curves shown in FIGS. 3A and 3B.

FIG. 3A shows transmission (in arbitrary units-au) vs. wavelength (nm) for NiMgO alloys according to an embodiment of the invention that evidences tuneablity of the operating wavelength by varying the metal concentrations in the alloy. FIG. 3B shows the absorption of the MgNiO alloy obtained by varying the metal concentrations, allowing for determination of the corresponding Energy Gap (Eg). The MBE conditions used comprised $T_{Ni}$=1325° C., $T_{sub}$=300° C., $FO_2$ ($O_2$ flow)=1.5 sccm, and $T_{Mg}$ that varied between 315° C. and 360° C. Increasing $T_{Mg}$ was found to increase the Mg concentration/decrease the Ni concentration in the alloy. The end points shown are MgO (no Ni) and NiO (no Mg), which are provided for reference only.

FIG. 4 shows data for the various samples shown in FIGS. 3A and 3B including the measured 25° C. Eg and estimated Mg concentration (with Ni concentrations being fixed for a given Mg concentration) for each of the curves shown in FIGS. 3A and 3B. The band gap for MgNiO layers at 25° C. is seen to be from 4.01 to 4.46 eV. Higher band gaps (e.g. in the range of 5 to 6 eV) could have been obtained by increasing $T_{Mg}$ above 360° C.

While various embodiments of the invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of this Disclosure should be defined in accordance with the following claims and their equivalents.

Although this Disclosure has been illustrated and described with respect to one or more implementations, equivalent alterations and modifications will occur to others skilled in the art upon the reading and understanding of this specification and the annexed drawings. In addition, while a particular disclosed feature may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting to this Disclosure. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this Disclosure belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A cubic epitaxial article, comprising:
a single crystal cubic oxide substrate having a substrate band gap and a top surface, and
an epitaxial cubic oxide alloy layer comprising at least one transition metal or group IIA metal disposed on said top surface of said substrate, wherein said epitaxial cubic oxide alloy layer has a band gap that is different than said substrate band gap and a lattice that is lattice matched within 5% to a lattice of said single crystal cubic oxide substrate.

2. The cubic epitaxial article of claim 1, wherein said band gap of said epitaxial cubic oxide alloy layer at 25° C. is from 4 to 6 eV.

3. The cubic epitaxial article of claim 2, wherein said band gap of said epitaxial cubic oxide alloy layer is narrower than said substrate band gap.

4. The cubic epitaxial article of claim 2, wherein said band gap of said epitaxial cubic oxide alloy layer is wider than said substrate band gap.

5. The cubic epitaxial article of claim 1, wherein said single crystal cubic oxide substrate is at least 50 $\mu m$ thick.

6. The cubic epitaxial article of claim 1, wherein said lattice of said epitaxial layer is lattice matched within 1.5% to said lattice of said single crystal cubic oxide substrate.

7. The cubic epitaxial article of claim 1, wherein said substrate band gap is at least 5.8 eV at 25° C.

8. The cubic epitaxial article of claim 7, wherein said single crystal cubic oxide substrate comprises MgO and said epitaxial cubic oxide alloy layer comprises Mg.

9. The cubic epitaxial article of claim 8, wherein said epitaxial cubic oxide alloy layer comprises MgO and transition metal.

10. The cubic epitaxial article of claim 9, wherein said transition metal comprises at least one Ni, Zn and Co.

11. The cubic epitaxial article of claim 10, wherein said at least one of Ni and Co comprises at least 20 to 80 wt % of said epitaxial cubic oxide alloy layer.

12. The cubic epitaxial article of claim 1, wherein said epitaxial cubic oxide alloy layer is exclusive of Mg.

13. The cubic epitaxial article of 1, further comprising an epitaxial buffer layer between said top surface of said single crystal cubic oxide substrate and said epitaxial cubic oxide alloy layer.

14. An electronic device comprising:
a single crystal cubic oxide substrate having a substrate band gap and a top surface, and
an epitaxial cubic oxide alloy layer comprising at least one transition metal or group IIA metal formed on said top surface of said substrate, wherein said epitaxial cubic oxide alloy layer has a band gap that is different than said substrate band gap and a lattice that is lattice matched within 5% to a lattice of said substrate, and
a pair of electrodes having said epitaxial cubic oxide alloy layer interposed therebetween.

15. The electronic device of claim 14, wherein said band gap of said epitaxial cubic oxide alloy layer at 25° C. is from 4 to 6 eV.

16. The electronic device of claim 15, wherein said band gap of said epitaxial cubic oxide alloy layer is narrower than said substrate band gap.

17. The electronic device 15, wherein said band gap of said epitaxial cubic oxide alloy layer is wider than said substrate band gap.

18. The electronic device of claim 14, wherein said single crystal cubic oxide substrate comprises MgO and said transition metal, and wherein said epitaxial cubic oxide alloy layer comprises Mg.

19. The electronic device of claim 18, wherein said transition metal comprises at least one of Ni, Zn and Co, and wherein said at least one of Ni, Zn and Co comprises at least 20 to 80 wt % of said epitaxial cubic oxide alloy layer.

20. The electronic device of claim 14, wherein said epitaxial cubic oxide alloy layer comprises a n-type epitaxial layer, a p-type epitaxial layer and a light emitting region between said n-type epitaxial layer and said p-type epitaxial layer, and wherein said electronic device comprises a light-emitting diode, laser diode, or a broad band light source.

* * * * *